(12) United States Patent
Brown

(10) Patent No.: US 6,340,821 B1
(45) Date of Patent: Jan. 22, 2002

(54) PROJECTION EYEPIECE AND METHOD FOR ALIGNING PATTERN AREAS ON OPPOSING SUBSTRATE

(75) Inventor: Daniel M. Brown, Madison, AL (US)

(73) Assignee: Mems Optical, Inc., Huntsville, AL (US)

( * ) Notice: Subject to any disclaimer, the term of this patent is extended or adjusted under 35 U.S.C. 154(b) by 0 days.

(21) Appl. No.: 09/321,730

(22) Filed: May 28, 1999

Related U.S. Application Data

(63) Continuation of application No. 09/196,784, filed on Nov. 20, 1998, now Pat. No. 6,222,198.

(51) Int. Cl.[7] ................................................ G01B 11/00
(52) U.S. Cl. .......................... 250/548; 356/399; 355/53
(58) Field of Search .............................. 250/548, 559.3, 250/557; 356/399, 400, 401; 355/43, 53; 430/313, 314, 394

(56) References Cited

U.S. PATENT DOCUMENTS 5,361,132 A * 11/1994 Farn ............................ 356/509
5,572,288 A * 11/1996 Mizutani ..................... 250/548

* cited by examiner

Primary Examiner—John R. Lee
Assistant Examiner—Kevin Pyo

(57) ABSTRACT

A projection eyepiece and method for aligning pattern areas on a substrate surface having a micro-optical device on an opposite surface side of the substrate is disclosed. The projection eyepiece enables projection of a reticle image onto a first surface of a substrate, enabling receipt of a reflection of that reticle image from a micro-optical device located on a second and opposing surface of the substrate, and enabling comparison of the projected and received image to determine alignment of the point of incidence on the first surface with the micro-optical device of the second surface. The projection eyepiece therefore determines alignment of pattern areas on opposing substrate surfaces by comparing a projected reticle image to a reflection of that projected reticle image.

30 Claims, 11 Drawing Sheets

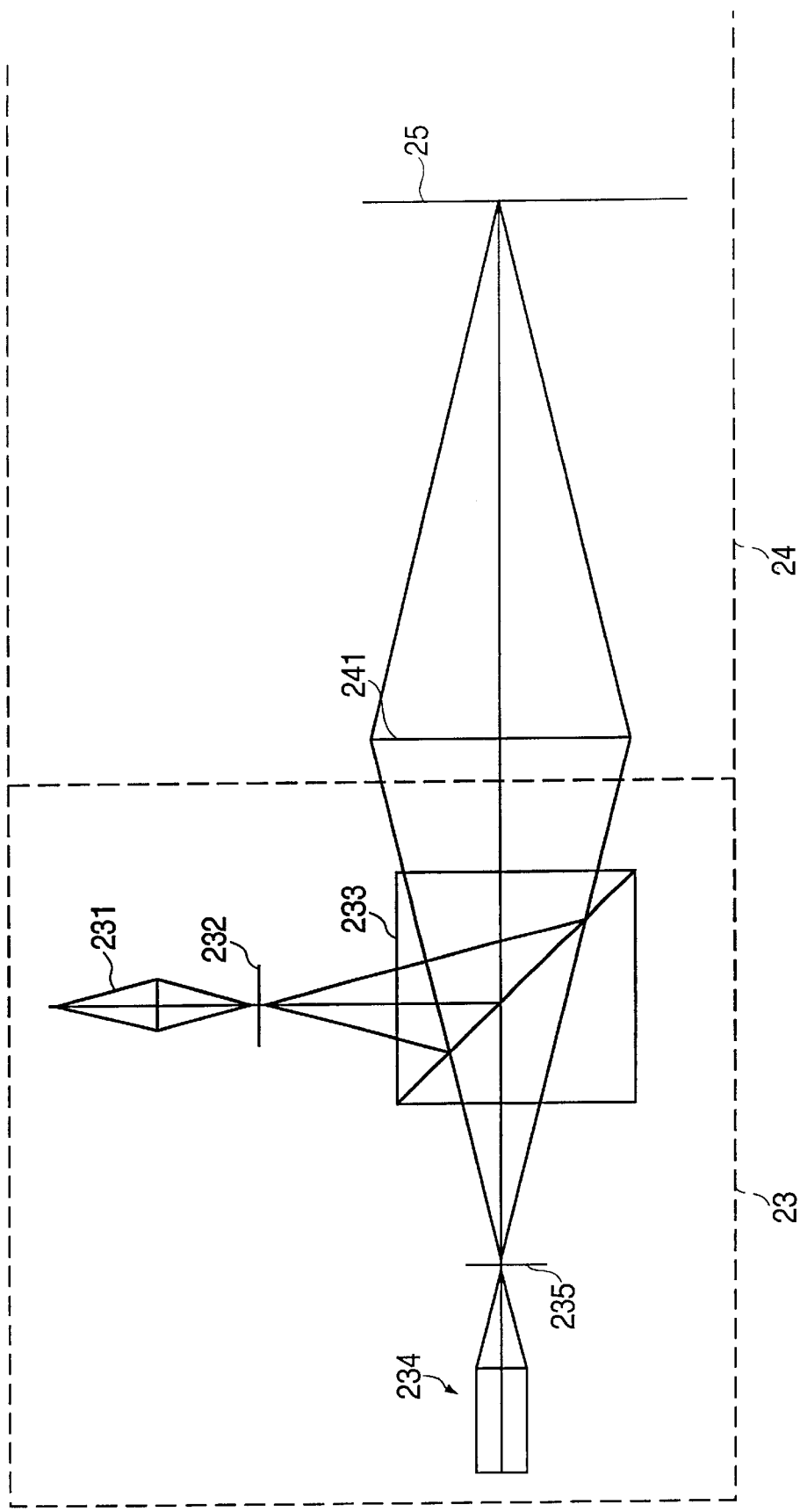

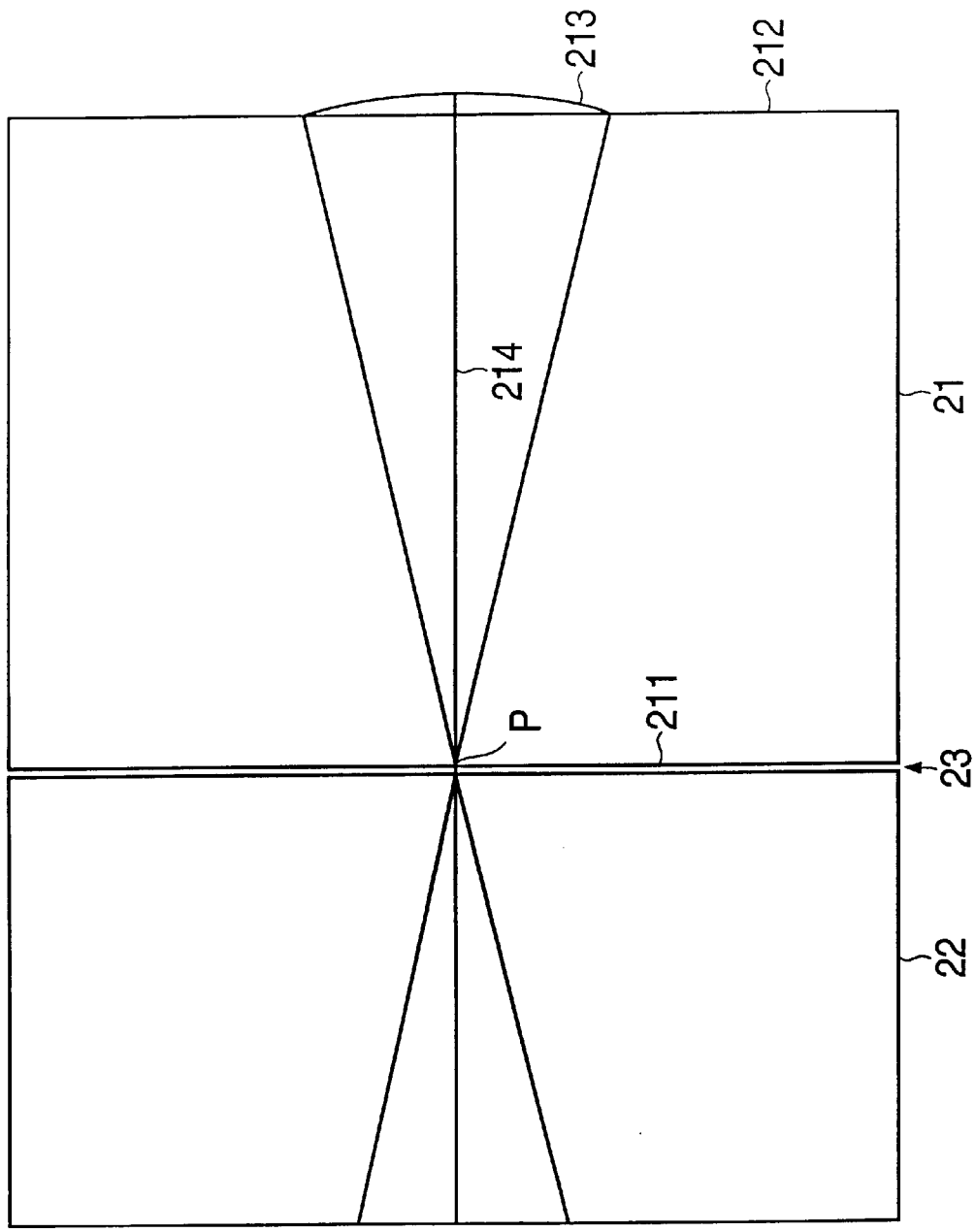

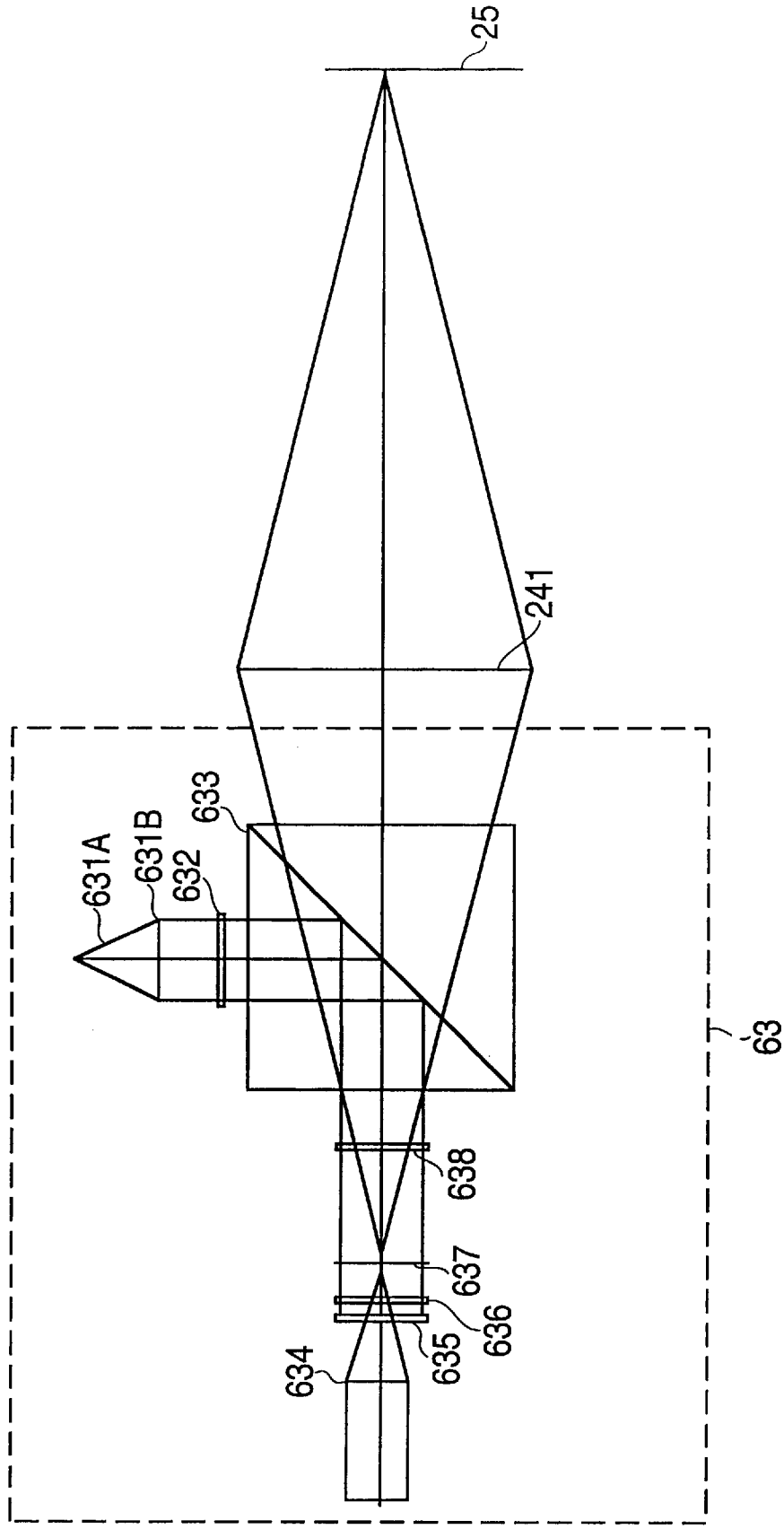

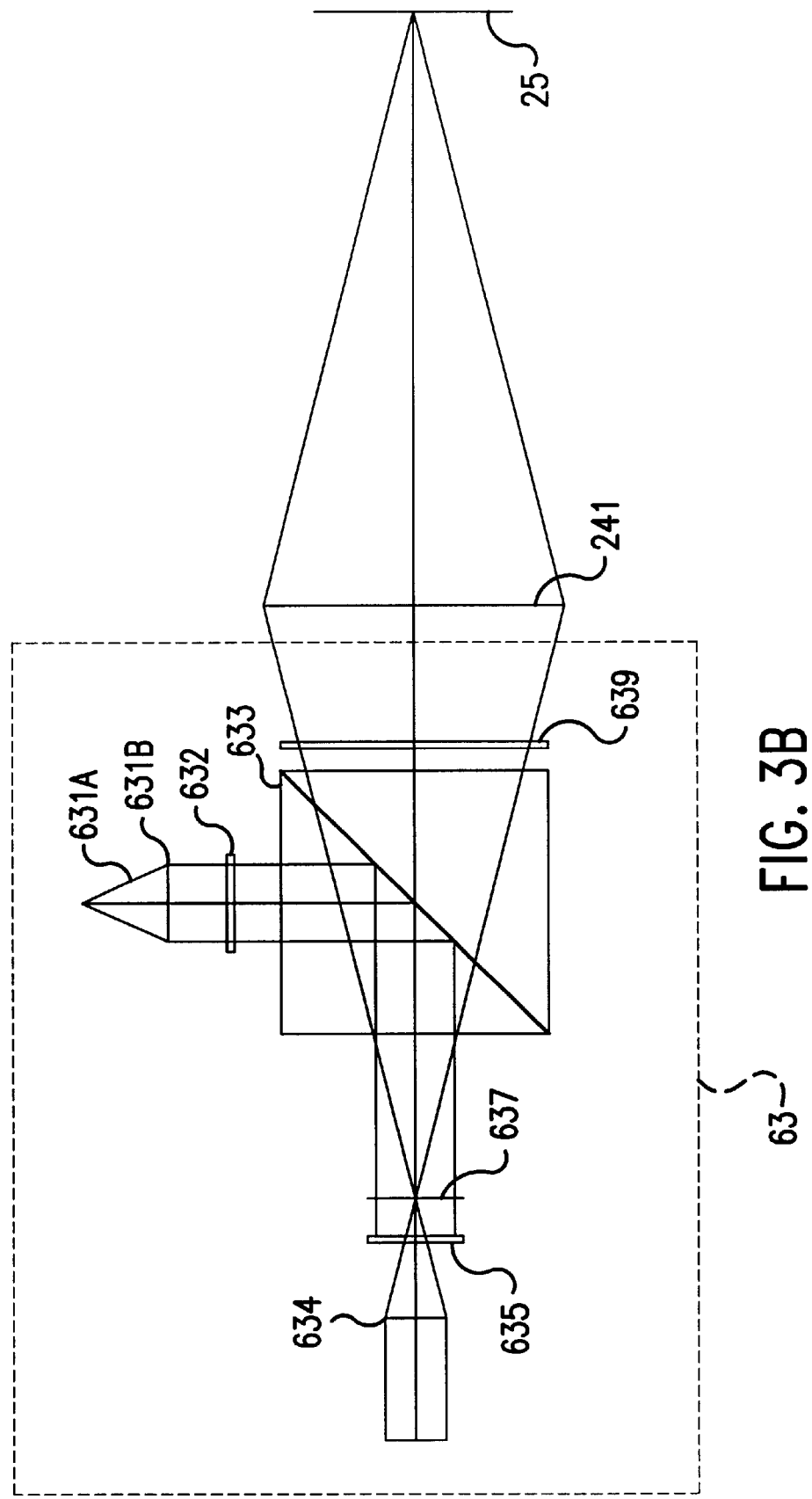

PROJECTION EYEPIECE AND METHOD FOR ALIGNING PATTERN AREAS ON OPPOSING SUBSTRATE

PRIORITY INFORMATION

This application is a continuing application and claims priority under 35 U.S.C. §120 based on the U.S. patent application Ser. No. 09/196,784 filed Nov. 20, 1998 by the same inventor, now U.S. Pat. No. 6,222,198, which application was entitled "A System and Method for Aligning Pattern Areas on Opposing Substrate Surfaces".

BACKGROUND OF THE INVENTION

1. Field of the Invention

The present invention relates to a projection eyepiece and method for aligning pattern areas on a substrate surface having a micro-optical device on an opposite surface side of the substrate. The projection eyepiece enables projection of a reticle image onto a first surface of a substrate, enabling receipt of a reflection of that reticle image from a micro-optical device located on a second and opposing surface of the substrate, and enabling comparison of the projected and received image to determine alignment of the point of incidence on the first surface with the micro-optical device on the second surface.

2. Description of the Related Art

Optical devices fabricated using photolithographic technology often require precise alignment of devices on both sides of a single substrate. For instance, it is sometimes necessary to etch optical lenslets, alignment marks, detectors or other devices into both sides of a thick (several millimeter) substrate, and to obtain a precise lateral arrangement of devices positioned on one side of the substrate with corresponding devices positioned on the opposite side of the substrate. Such precise alignment is difficult to achieve, particularly when the substrate is too thick for the mask aligner microscope or the substrate is opaque to visible light.

FIGS. 1A–1B illustrate how a conventional mask aligner (either visible or infrared) is used to align devices on opposite sides of a substrate, FIG. 1A showing the mask aligner focused on the distal (lower) substrate surface and FIG. 1B showing focus on the proximate (upper) substrate surface. More specifically, the microscope objective 11 of the mask aligner is positioned above the mask 12 and substrate 13. The mask pattern 15 is positioned on the lower surface of the mask and in contact with the photoresist coated on top of substrate 13. An alignment mark 14 has been previously etched into the lower surface of a substrate.

The mask aligner is designed to align an alignment mark 15 of mask 12 with the alignment mark 14 positioned on the lower opposing surface of substrate 13, so that the mask pattern can be transferred into the photoresist on the top surface of substrate 13. To achieve alignment, the microscope objective 11 of the mask aligner is alternatingly focused on the top and bottom alignment marks 14 and 15 by translating the microscope objective 11 perpendicular to the surface of substrate 13.

The distance that the microscope objective must be translated is equivalent to the thickness W1 of the substrate 13 divided by the index of refraction n of the substrate 13 (e.g., n=1.5). For instance, the microscope is first centered on the lower alignment mark 14, often with the aid of a reticle or cross hair in the eyepiece of the microscope. The microscope is then vertically translated to focus on the top or photoresist surface of the substrate, where the mask is moved laterally to center its alignment mark in the field of view of the microscope. After exposing and developing the photoresist, the substrate is etched to transfer the pattern from the photoresist into the surface of the substrate.

To achieve accurate top-to-bottom alignment using a conventional mask aligner, as described, the microscope must be precisely translated in a direction perpendicular to the surfaces of the substrate. If the microscope is not translated perpendicular to the surfaces, a lateral change in position of the microscope will result, causing the two patterns on the opposite surfaces to be misaligned.

Conventional mask aligners are not generally designed for precise perpendicular translation of the microscope body. Rather, the normal wobble and straightness of travel tolerances in mask aligner microscope translation stages is large enough to introduce several microns of lateral error in the alignment. In fact, recent experiments using a state-of-the-art conventional mask aligner showed more than twenty (20) microns of lateral alignment error between the patterns placed on opposite surfaces of a typical substrate. Consequently, conventional mask aligners of this type are susceptible to error.

Another conventional system used to achieve front-to-back alignment involves two video cameras used to focus upon the alignment marks positioned on opposite sides of the substrate, the two images from the cameras being superimposed electronically to show lateral alignment of the two marks. However, use of this system to align substrates of different thicknesses is limited, since the system must be calibrated for a fixed substrate thickness using a calibration plate which has alignment marks precisely placed on both sides of the plate by the manufacturer of the mask aligner.

SUMMARY OF THE INVENTION

The present invention is directed to an apparatus and method that substantially obviates one or more of the problems experienced due to the above and other limitations and disadvantages of the conventional art.

An object of the present invention is to provide a projection eyepiece and method for aligning pattern areas on opposing substrate surfaces with improved accuracy.

Other and further objects, features, and advantages of the present invention will be set forth in the description that follows, and in part will become apparent from the detailed description, or may be learned from the practice of this invention.

To achieve these and other objects, features, and advantages in accordance with the purpose of the present invention as embodied and broadly described, the present invention includes a protection eyepiece device that detects alignment between positions on opposing surfaces of a substrate having a reflective surface on at least a portion of one surface side, the eyepiece including a reticle source structured and arranged to project a reticle image toward the substrate, and a detection device structured and arranged to receive a reflection of the reticle image from the substrate and to determine alignment of the positions on opposing surfaces of the substrate based on the received reflection. The reticle source is structured and arranged to project the reticle image with a focal point on a first side of the substrate, the reflection of the reticle image generally being received by the detection device from a second and opposing surface of the substrate. The reticle source generally includes a source capable of projecting light and a reticle position to receive the projected light from the source, the reticle being structured and arranged such that light therefrom forms a reticle image. The detection device generally includes a plane upon which the received reflection is compared with at least one of the projected reticle image and a representation of the projected reticle image. A second reticle is sometimes used to generate the representation of the projected reticle image on the plane with which the received reflection is compared to determine alignment. The reticle source may further include a beam splitter on which the reticle image is instant, the beam splitter being structured and arranged to split the instant reticle image such that the reticle image is projected toward the substrate and toward the detection device. The reticle device may alternatively include a polarization sensitive beam splitter upon which the reticle image is incident, the beam splitter being structured and arranged to reflect instant light of a first predetermined polarity and pass instant light of a second predetermined polarity, and a linear polarizer positioned to receive light from the source, the linear polarizer being structured and arranged to pass light of the first predetermined polarity such that the light passing through the linear polarizer is reflected by the polarization sensitive beam splitter. The beam splitter is structured and arranged to reflect light of the first predetermined polarity toward the detection device. The detection device generally includes an image perceiving device structured and arranged to receive at least the reflection of the reticle image from the substrate and a second linear polarizer positioned between the reticle and the image perceiving device, the linear polarizer being structured and arranged to block light from the source that passes through the reticle. In the projection eyepiece, the reticle is a reflective reticle that generates the reticle image by reflecting light incident from the beam splitter, the reticle being positioned between the image perceiving device and the beam splitter. The reticle source generally includes a quarter wave plate positioned between the beam splitter and the reflective reticle, and the detection device includes a quarter wave plate positioned between the reflective reticle and the second linear polarizer.

When the source is structured and arranged to project polarized light, the reticle source generally includes a non-polarizing beam splitter upon which the polarized light is incident, the beam splitter being structured and arranged to reflect the incident polarized light and to pass light that is orthogonal to the incident polarized light. The detection device generally includes an image perceiving device structured and arranged to receive at least the reflection of the reticle image from the substrate, and a linear polarizer positioned between the reticle and the image perceiving device, the linear polarizer being structured and arranged to block light passing through the reticle from the source. The detection device may also include a quarter wave plate positioned between the beam splitter and the substrate.

The source generally includes a light source capable of generating light, a collimator capable of collimating the generated light, and a linear polarizer capable of polarizing the collimated light. The source may alternative include a light source capable of generating light, a focusing lens and diffuser grating capable of focusing the generated light onto reflected positions of the reticle and a linear polarizer capable of polarizing the collimated light.

The present invention also includes a method for detecting alignment between positions on opposing surfaces of a substrate having a reflected surface on at least a portion of one surface side.

Both the foregoing general description and following detailed description are exemplary and explanatory and are intended to provide further explanation of the invention as claimed. Thus, it should be understood that the detailed description and specific examples, while indicating preferred embodiments of the present invention are given by way of example only, since various changes and modifications that are within the spirit and scope of the invention will become apparent to those of ordinary skill in the art from this detailed description.

BRIEF DESCRIPTION OF THE DRAWINGS

The present invention will become more fully understood from the detailed description below along with the drawings, which are given by way of illustration and thus do not limit the actual implementation of the present invention, wherein:

FIGS. 2A–2C illustrate a mask aligner according to a first embodiment of the present invention, and show the relationship of that mask aligner to a mask and a substrate having opposing surfaces on which alignment marks will be aligned;

FIGS. 3A–3C illustrate projection eyepieces according to second, third and fourth preferred embodiments of this invention;

DETAILED DESCRIPTION OF THE PREFERRED EMBODIMENTS

Figure 1A:
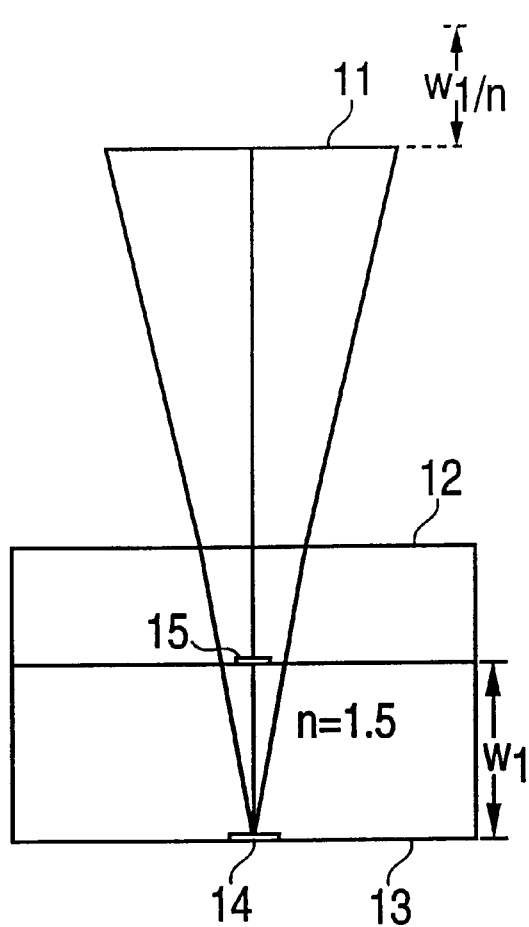
FIGS. 1A–1B illustrate the operation of a conventional mask aligner.
Figure 1B:
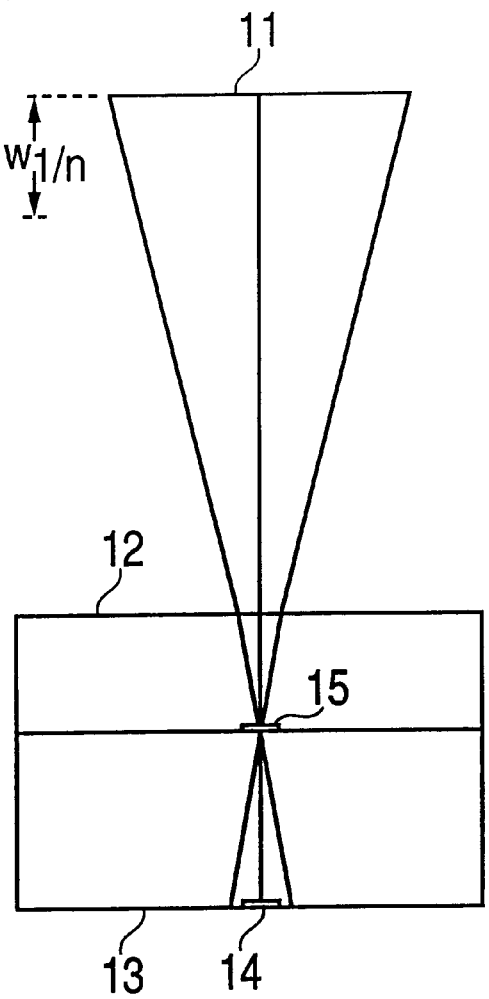

Reference will now be made in detail to the preferred embodiments of the present invention, examples of which are illustrated in the accompanying drawings. In the drawings, redundant description of like elements and processes, which generally are designated with like reference numerals, is omitted for brevity.

The following is a detailed description of several preferred projection eyepieces according to the present invention. The projection eyepieces are described as being incorporated into a mask aligner. As such, a description is also provided with respect to a substrate and mask and a process used to align the substrate and mask using a mask aligner incorporating one of the preferred projection eyepieces.

The Mask Aligner

Figure 2B:
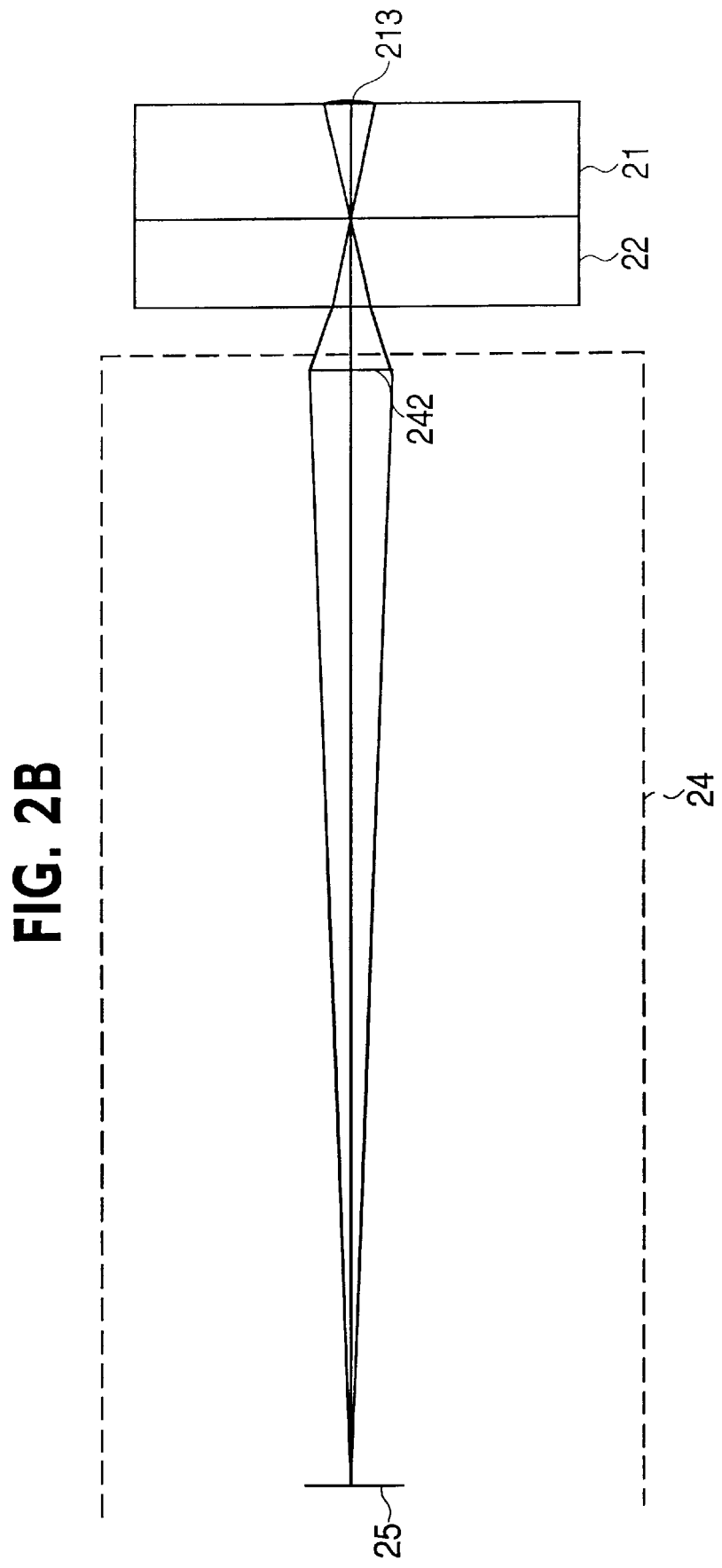

FIGS. 2A–2B illustrate an exemplary mask aligner in accordance with a first embodiment of the present invention. The mask aligner of FIGS. 2A–2B includes a projection eyepiece 23 and a microscope body 24. The projection eyepiece 23 shown in FIGS. 2A–2B is similar to that typically used in autocollimation telescopes.

The projection eyepiece 23 contains a visible or infrared source 231 which illuminates a source reticle 232. An image of the source reticle 232 is projected down the microscope body 24 by beam splitter 233 and relay lens 241. Detection device 234 is typically either a visible or infrared camera focused on reticle 235. However, detection device 234 may be a conventional microscope eyepiece for human visual operation.

In the projection eyepiece 23, reticles 232 and 235 are aligned with respect to each other such that their positions are mirror images of each other about the reflecting plane of beam splitter 233. In other words, if an observer were to look back into the eyepiece from the right (e.g. from position 241), the observer would observe the two reticles 232 and 235 superimposed on top of each other. Image plane 25 is therefore simultaneously a conjugate image plane of both reticles 232 and 235.

Microscope body 24 includes an arrangement of lenses, including a microscope objective 242 arranged to produce an image of the mask pattern (located at the interface between mask 22 and substrate 21) onto the image plane 25. Together with the projection eyepiece 23, the microscope body 24 also focuses light from source reticle 232 and forms an image of the source reticle 232 onto the photoresist-coated surface of substrate 21, which is also located at the interface of mask 22 and substrate 21. The four conjugate image-object planes of the system include; reticles 232 and 235, image plane 25, and the interface between mask 22 and substrate 21.

Generally, image plane 25 of microscope objective 242 is located inside the microscope body 24. For proper operation, the reticles 232 and 235 must be coincident with image plane 25, but the beam splitter 233 may prevent physical location of the reticles at image plane 25. In such a case, a relay lens 241 is preferably included as an attachment to the microscope body 24 (as shown) to reimage the reticles onto image plane 25 of microscope objective 242 with the proper magnification. The light returned from the substrate 21 produces an image at image plane 25 before being reimaged by relay lens 241 onto reticle 235. The displacement between the image formed at reticle 235 and the actual reticle 235 is used to determine alignment between the mask 22 and substrate 21.

The relay lens 241 may alternatively be included in the projection eyepiece 23 (not shown). Also, relay lens 241 can serve to remove aberrations produced by focusing light through beam splitter 233 if beam splitter 233 is a cube beam splitter.

In the preferred embodiment, the distance between lenses 241 and 242, as well as the specific optical power of relay lens 241, is defined by the specific optical and mechanical configuration of the mask aligner and the required magnification at camera 234. The specific optical prescription may therefore be determined by routine lens design or experimentation. Image plane 25 is generally located at a position corresponding to a reticle or cross hair in the conventional eyepiece of a microscope or mask aligner. Furthermore, the substrate 21 and mask 22 may be positioned precisely with respect to the microscope lens using well-established conventional means, such as those customarily used on conventional mask aligners.

FIGS. 3A and 3B illustrate projection eyepieces in accordance with a second and third embodiment of the present invention, respectively. The eyepieces shown in FIGS. 3A and 3B can be substituted for the projection eyepiece shown at reference numeral 23 of FIG. 2A. Unlike the projection eyepiece 23 of FIG. 2A which has two distinct reticles 232 and 235 that must be precisely aligned relative to beam splitter 233, the projection eyepieces shown in FIGS. 3A and 3B require only one reticle.

Specifically, the projection eyepiece 63 of FIG. 3A consists of the following components: a visible or infrared source 631A, source collimating lens 631B, linear polarizer 632, polarization sensitive cube beam splitter 633, quarter wave plate 638, reflective reticle 637, quarter wave plate 636, linear polarizer 635, and camera or eyepiece lens 634. As in FIG. 2A, the projection eyepiece 63 may include a relay lens 241 for the same reasons as discussed earlier. The polarization beam splitter 633 causes s-polarized light to be reflected at the reflecting interface and p-polarized light to be transmitted through it. The linear polarizer 632 is oriented to produce s-polarized light incident on the polarization cube beam splitter 633. The source light from source 631A, which passes through source collimating lens 631B and linear polarizer 632, is reflected off the interface of beam splitter 633 toward quarter wave plate 638. Quarter wave plate 638 is oriented 45 degrees with respect to the polarization direction so that the light becomes circularly polarized upon transmission therethrough. Reticle 637 consists of a reflective, metallic cross hair or other reflective reticle pattern with clear surrounding regions, e.g., produced by photolithography and chemical etching. Some of the source light reflects off the metallic regions of the reticle and makes a second pass through quarter wave plate 638, whereupon the reflected light becomes p-polarized light with respect to the beam splitter 633. This p-polarized light, which appears to be emanating from reticle 637, passes through the beam splitter and is imaged by relay lens 241 onto image plane 25. The circularly polarized source light, which is not reflected at reticle 637, passes through quarter wave plate 636 where it is converted into p-polarized light. Linear polarizer 635 is oriented to block p-polarized light, preventing this extraneous light from reaching the camera or eyepiece lens 634.

The p-polarized light projected down the microscope body by relay lens 241 is imaged onto the substrate as described previously. When this light is reflected from the substrate, it remains p-polarized. The p-polarized light reflected from the micro-mirrors (not shown in this figure, but shown as 213 in FIG. 2C) again passes through the cube beam splitter 633, through quarter wave plate 638, where it is converted to circularly polarized light. The light then passes through the second quarter wave plate 636, where it is converted into s-polarized light which passes through linear polarizer 635. Thus the light from the micro-mirrors passes through to the camera or eyepiece lens 634, but the extraneous light from source 631 is blocked, providing a high signal-to-noise ratio.

FIG. 3B shows yet another embodiment of the projection eyepiece of the present invention, which embodiment uses a non-polarizing beam splitter 633. In FIG. 3B, quarter-wave plates 638 and 636 are replaced with a single quarter wave plate 639 located between the beam splitter 633 and relay lens 241. Polarized light from the source 631 is therefore again blocked by polarizer 635 which is oriented to pass light only in the orthogonal direction. However, after making two passes through the quarter wave plate, once down the microscope body and again on its return trip, the reflected light becomes polarized in the orthogonal direction, causing it to pass through polarizer 635 to reach the camera or eyepiece lens 634.

Figure 3C:
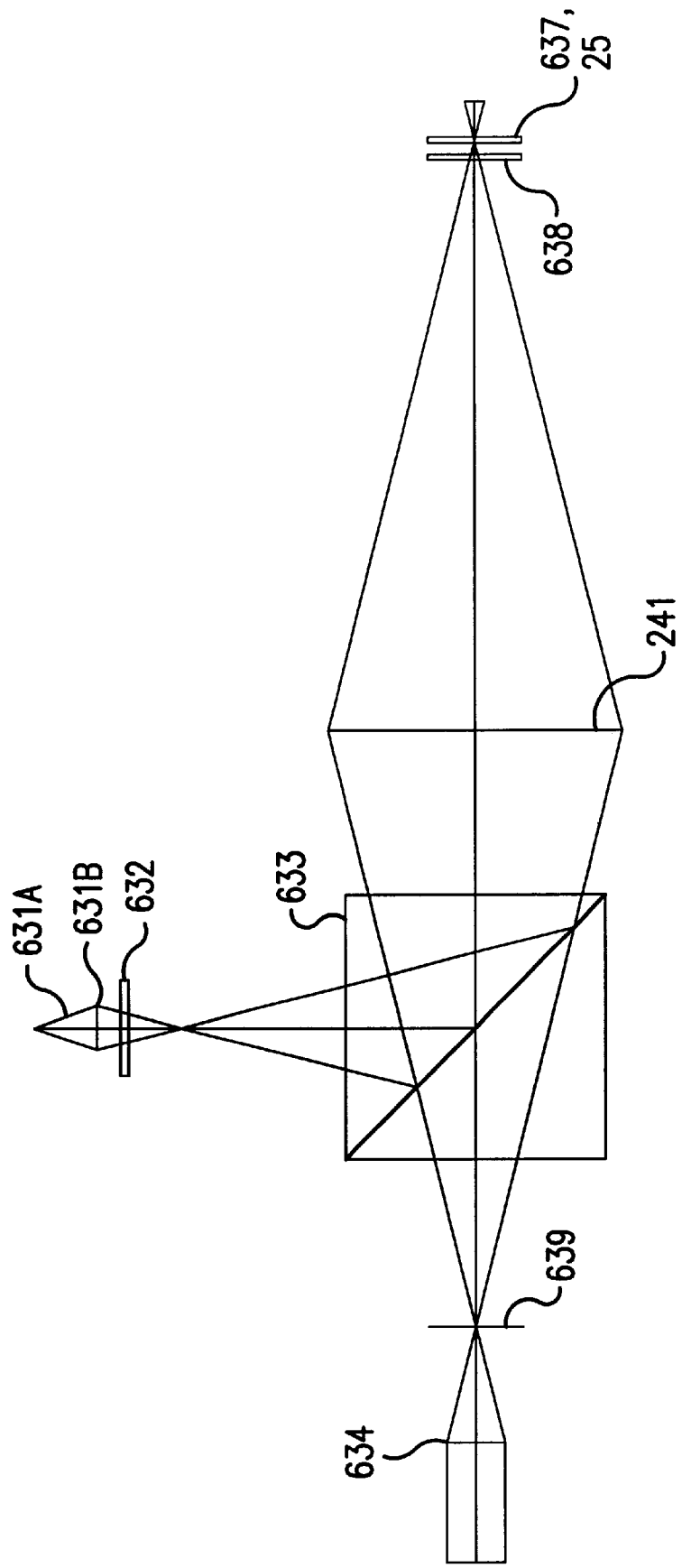

FIG. 3C shows an alternative embodiment of the projection eyepiece of FIG. 3A, which embodiment moves the quarter wave plate 638 to a position between the polarization beam splitter 633 and image plane 25. Reticle 637 is also moved to be coincident with image plane 25. Reticle 637 is reimaged to position 639 by relay lens 241. Beam splitter 633 is oriented to reflect s-polarized light from source 631 toward reticle 637. After two passes through quarter wave plate 638, the s-polarized light becomes p-polarized light and passes through beam splitter to eyepiece or camera 634.

Yet another alternative embodiment (not shown) replaces collimating lens 631B of FIGS. 3A–3C with a focusing lens and diffuser grating to focus the majority of the light from source 631A onto the reflective portions of reticle 637.

From the operator's perspective, the projection eyepieces of FIGS. 3A and 3B are identical in operation to that of FIG.

2A. However, as mentioned previously, the projection eyepieces shown in FIGS. 3A and 3B do not require the optical alignment of two distinct reticles to be maintained.

Specifically, the projection eyepiece of FIG. 2A requires reticle 232 to be aligned with reticle 235. If the two reticles are misaligned, their images will not be optically superimposed at the projection eyepiece, nor will their images overlap at image plane 25 when true alignment is realized, causing a systematic mask alignment error. However, it is difficult to attain this alignment, and even more difficult to maintain this alignment with normal handling and wear. Since one physical reticle is used to produce both the source and image comparison reticles, alignment of multiple reticles is not necessary to achieve optical overlap. Thus, the projection eyepieces of FIGS. 3A and 3B each alleviate the need for precise alignment by using the same reticle for both the source and image comparison reticles.

Note that in each of the preferred embodiments, the existing eyepiece or camera of a conventional device mask aligner may be replaced with the projection eyepieces of the present invention, such as those shown in FIGS. 2A, 3A and 3B. Thus, by adopting the unique design of the above-described projection eyepieces and by including specific optical devices on the substrate, existing commercial mask aligners can be modified to implement this invention.

The Substrate

The substrate is identified in FIGS. 2B and 2C by reference numeral 21. Substrate 21 is fabricated from a material that is transparent to the light used to project the reticle image onto the substrate. If the substrate is transmissive to infrared light but not visible light, such as silicon or germanium, then an infrared source and camera are used in the projection eyepiece. By contrast, for substrates which transmit visible light, such as fused silica, gallium phosphide or zinc selenide, a visible source and camera (or microscope eyepiece) are used in the projection eyepiece. Various other materials may also be used for the substrate, so long as they are optically transparent to either visible light or infrared light.

Substrate 21 has a first substrate surface 211 and an opposing second substrate surface 212. First substrate surface 211 is coated with photoresist 23 which contacts mask 22. The mask pattern lies on the surface of mask 22 that contacts the photoresist 23. The photoresist layer 23 between the mask pattern of mask 22 and first substrate surface of 211 ranges in thickness from less than one micron to several microns, depending on the application or device to be transferred into the substrate. At least one alignment mark and at least one reflective micro-optical device 213 (hereinafter a "micro-mirror") are fabricated onto the second substrate surface 212. Generally, more than one alignment mark and one micro-mirror are used in order to remove both rotational and translational alignment errors. Alignment marks may be positioned anywhere on the second substrate surface 212, but the position of the alignment marks must be precisely known relative to the position of the micro-mirrors 213 in order for the alignment marks to be used for subsequently fabricating micro-devices on the second substrate surface 212. Alternatively, if the micro-devices and the micro-mirrors 213 are simultaneously fabricated on surface 212 using the same mask so that no further processing on surface 212 is required, then additional alignment marks other than the micro-mirrors 213 would not be necessary on surface 212.

Micro-mirrors 213 are used to establish reference positions on the first substrate surface 211 that are precisely positioned with respect to reference positions on the second substrate surface 212. In the simplest embodiment, each micro-mirror 213 is a concave mirror with a radius of curvature equal to the thickness of the substrate 21 and with an optical axis 214 which is perpendicular to the surface of the substrate 21, as illustrated in FIG. 2C. In this embodiment, point P, which lies on the optical axis 214, is simultaneously a conjugate object and image point, and surface 211 is simultaneously a conjugate object and image plane. Therefore, in this embodiment, a point of light focused to the left of P on surface 211 will be imaged to the right of P on surface 211, and vice versa. Alternate embodiments include micro-mirrors 213 formed of reflective diffractive optical elements, diffraction gratings, or a complex holographic optical elements. However, in each of these embodiments, the micro-mirror 213 collects light from an image formed on the first substrate surface 211 near its optical axis 214, and focuses the light to form a second image on the first substrate surface 211. Thus, the micro-mirrors 213 are sensitive to the lateral position of the first image formed on the first substrate surface 211, such that a first image that is centered on the optical axis of the micro-mirror 213 will coincide with its reflected second image from the micro-mirror 213. Otherwise, when a first image is not centered on the optical axis of micro-mirror 213, a detectable lateral displacement will be observed between the first image and its reflected second image.

There are a number of different methods for fabricating the micro-mirrors and alignment marks on the second substrate surface 212, most all of which use some form of photolithography. The micro-mirrors 213 may be etched into the surface of the substrate 21, or they may be fabricated in a thin film or coating on the second substrate surface 212. Some of the methods for fabricating micro-optical devices are discussed in *Micro-optics and Lithography,* Maria and Stefan Kufner, VUB University Press, Brussels, Belgium, 1997.

The Mask

The mask is identified in FIGS. 2B and 2C by reference numeral 22. Mask 22 is preferably a gray scale mask which is capable of achieving one-step fabrication of the micro-optical device. However, other conventional masks such as chrome masks may be used. Mask 22 is placed in contact with the photoresist-coated substrate 21. The side of mask 22 in contact with the photoresist 23 contains the mask pattern to be transferred into the photoresist 23. The mask pattern contains alignment marks which are to be centered on the optical axes of the micro-mirrors 213. The mask aligner has devices, such as a micrometer adjustment, to precisely translate the mask 22 laterally with respect to the substrate 21. In addition to the alignment marks for centering the optical axes of the micro-mirrors 213, the mask 22 may contain patterns for other micro-devices, including additional alignment marks for subsequent fabrication processes.

Process for Aligning the Substrate and the Mask

Figure 4A:
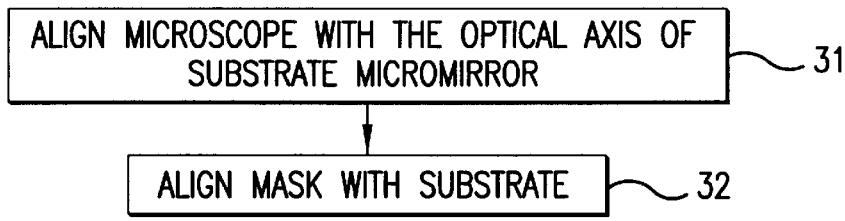
FIGS. 4A–4C illustrate steps of an exemplary process used to align a substrate and mask according to the present invention.
Figure 4B:
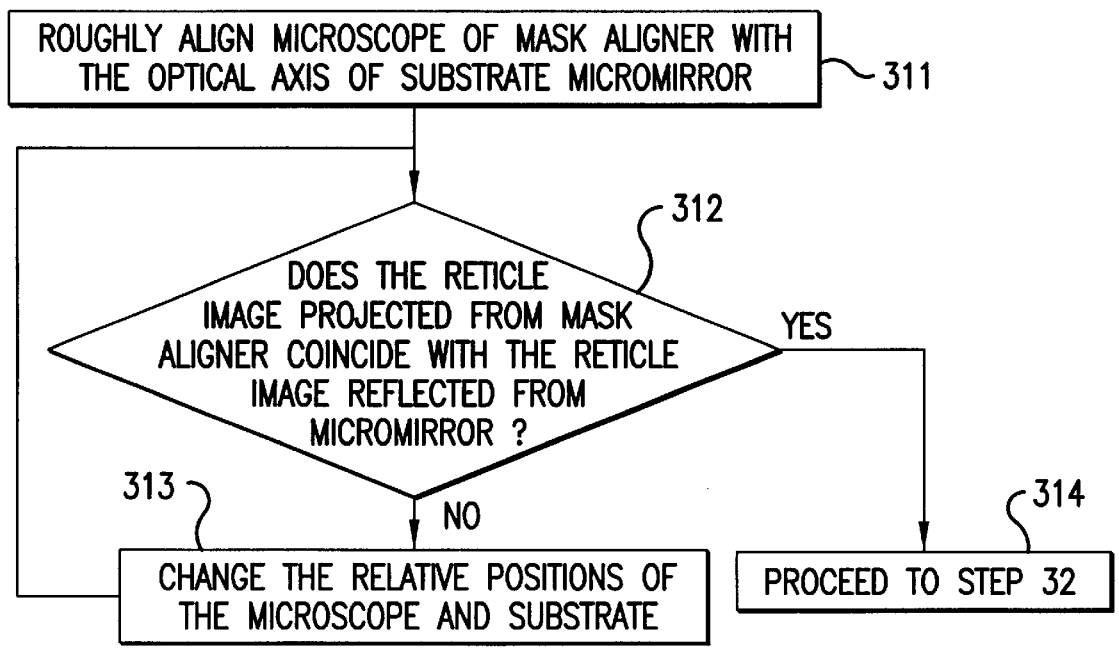
Figure 4C:
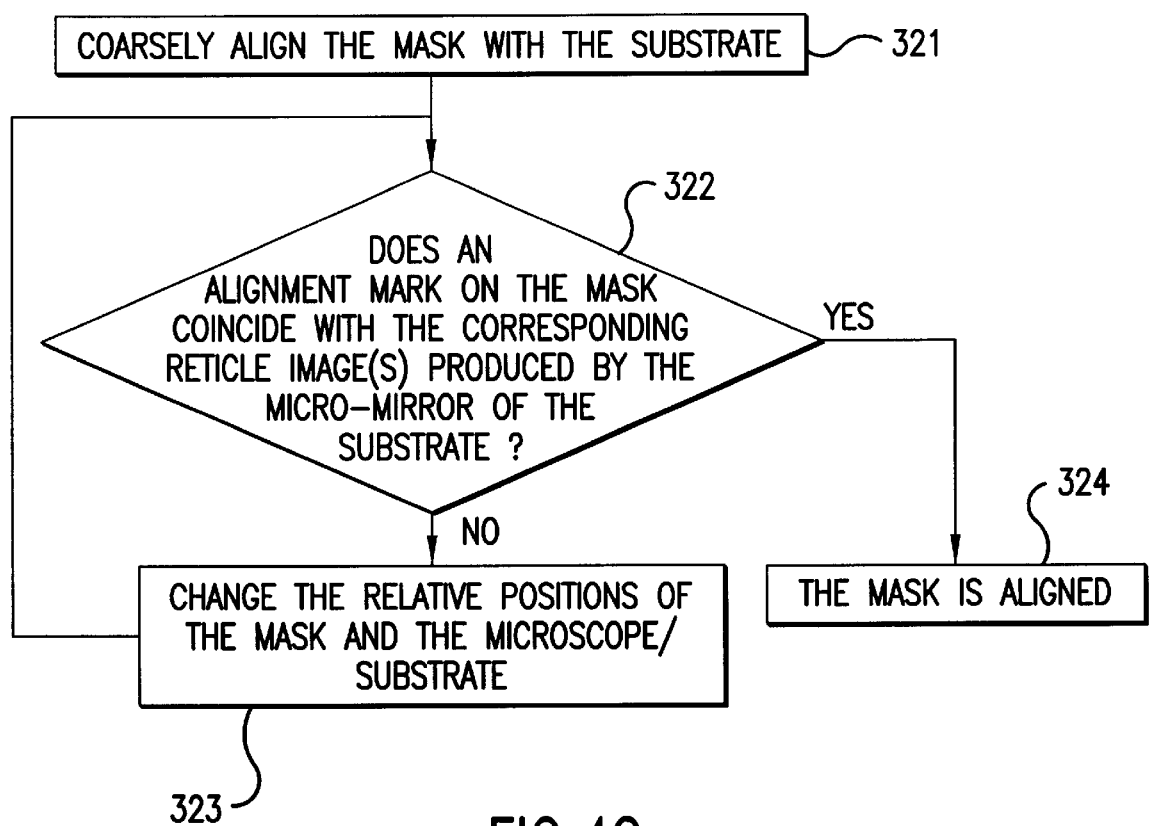

The flowcharts of FIGS. 4A–4C show steps in an exemplary process used to align a substrate and mask using a mask aligner having the above-described mask, substrate, and projection eyepiece. In step 31 of FIG. 4A, the cross hair or reticle of the mask aligner microscope is aligned with the optical axis of one of the micro-mirror devices positioned on the distal substrate surface. In this step, the relative positions of the microscope and substrate are changed until coincidence is achieved between the two images of the reticle at image plane 25, indicating alignment of the microscope with the optical axis of the target micro-mirror device on the substrate. Once the microscope is aligned with the optical axis of the micro-mirror device, an alignment mark on the mask is brought into coincidence with the microscope reticle in step 32, thereby aligning the mask with the substrate.

More specifically, FIG. 4B shows steps in an exemplary process for aligning the microscope with the optical axis of a substrate micro-mirror according to step 31 of FIG. 4A, and FIG. 4B shows steps in an exemplary process for aligning the mask with the substrate according to step 32 of FIG. 4A. The mask holder and substrate chuck on most all-commercial mask aligners are generally able to roughly align the mask with the substrate within a tolerance of better than 1 mm. Therefore, the optical axis of the micro-mirrors will be within the vicinity (<1 mm) of the corresponding alignment marks on the mask, which are easily found under low power magnification of the microscope. If the substrate is thin enough, the user will also see a blurred outline of the micro-mirror which can be used to help align the microscope on the optical axis of the micro-mirror device. The rough alignment achieved by this method is generally sufficient to detect reflected light from the micro-mirror.

In step 311 of FIG. 4B, the microscope of the mask aligner is roughly aligned with the micro-mirror of the substrate. In step 312, the reticle image projected from the mask aligner is compared with the reticle image reflected from the micro-mirror on image plane 25. If the images coincide, the microscope is deemed to be aligned with the optical axis of the substrate micro-mirror, and the process proceeds to step 32 for alignment of the mask with the substrate. By contrast, if the images do not coincide, the relative positions of the microscope and substrate are changed in step 313, and the process is returned to step 312 for an updated comparison of the images. Micrometer or micropositioner devices are generally used to change the relative positions of the microscope or the substrate chuck.

In step 321 of FIG. 4C, the mask is coarsely aligned with the substrate. The image of an alignment mark on the mask is then compared with the coincident images produced by the micro-mirror of the substrate in step 322. If the alignment marks and coincident reticle images are determined to coincide in step 322, the mask and substrate are deemed aligned in step 324. However, if the alignment marks are not determined to coincide in step 322, the relative positions of the mask and microscope/substrate are changed in step 323, and the process is returned to step 322 to perform an updated comparison of the alignment marks.

The processes described with respect to FIGS. 4A–4C can be repeated for at least two widely separated micro-mirrors on the substrate in order to remove both translational and rotational errors between the mask and substrate.

Figure 5A:
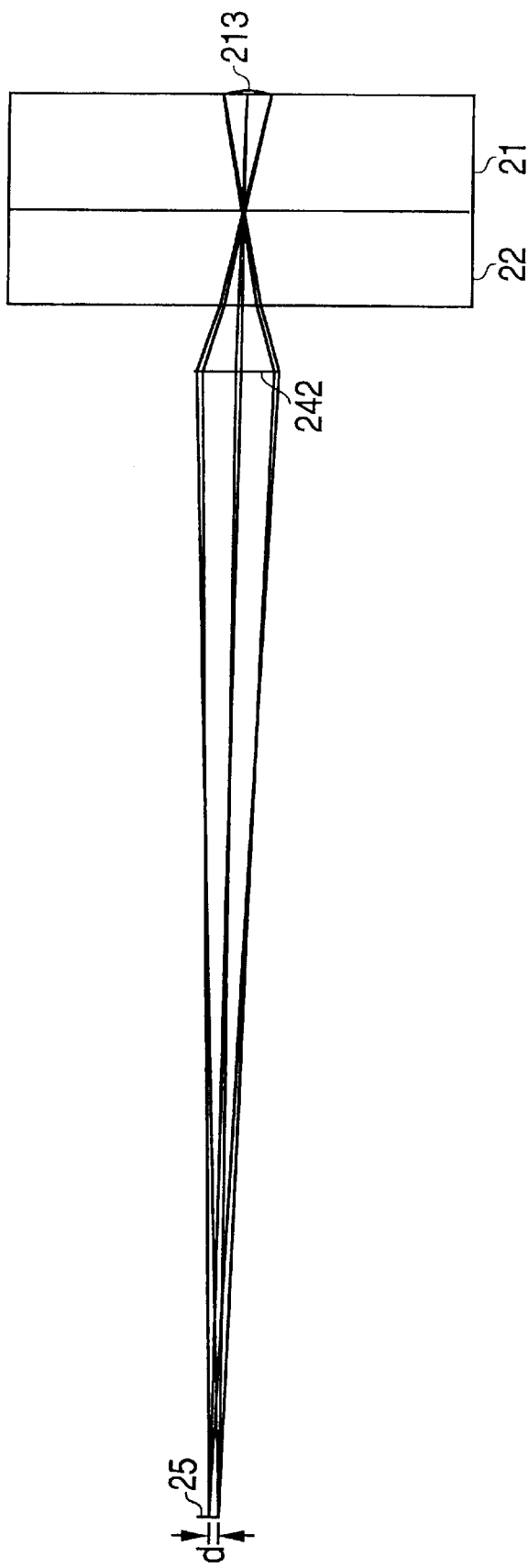
FIGS. 5A–5B illustrate the lateral displacement between the two images of the reticle due to misalignment between the patterns on opposite sides of the substrate.
Figure 5B:
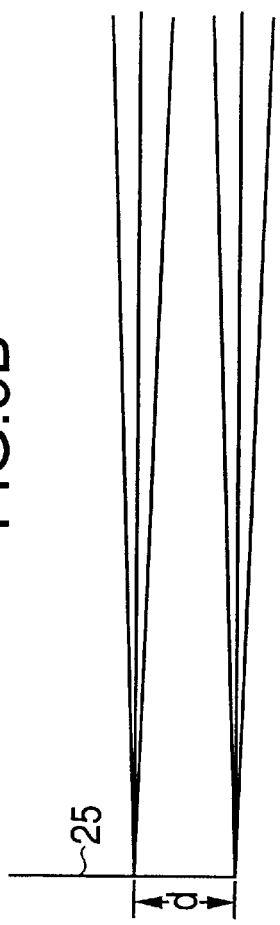

FIGS. 5A–5B illustrate the lateral displacement (d) of the two images at image plane 25 when microscope objective 242 is not aligned with the optical axis of micro-mirror 213. The magnitude of the displacement is equal to twice the alignment error times the magnification of the objective. Thus, using a 40×microscope objective, a 5-micron alignment error will result in a 400-micron displacement between the two reticle images.

Figure 6:
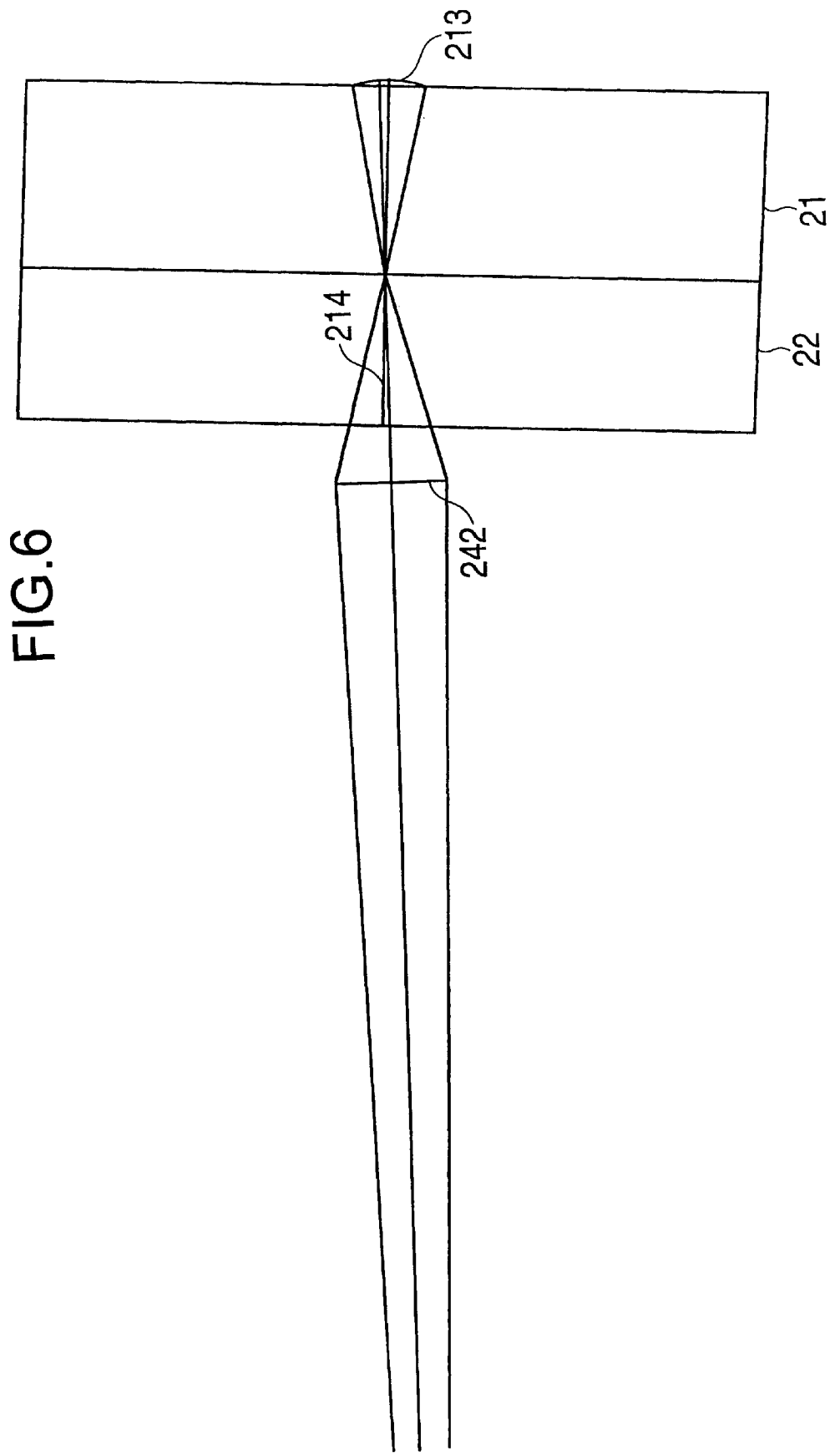
FIG. 6 illustrates the inconsequential effects of a substrate whose surfaces are inclined with respect to the microscope of the mask aligner using this invention.

Unlike the conventional top-to-bottom alignment method of vertically translating the microscope to alternately focus on opposite surfaces of the substrate, the above-described process is relatively stable, even when tilt is experienced between the substrate and microscope. FIG. 6 illustrates an example of a substrate and mask tilted with respect to the microscope, where the degree of the tilt is exaggerated for clarity.

In FIG. 6, microscope objective 242 is focused on the optical axis 214 of the micro-mirror 213 at the conjugate object and image planes of the micro-mirror (located at the interface between mask 22 and substrate 21). As shown, no displacement occurs between the two images at image plane 25 and no misalignment is detected as a result of the tilt. From this example, one of ordinary skill will appreciate that the system's capability to perform the top-to-bottom alignment is not affected by the perpendicularity of the microscope with respect to the substrate surface. Rather, alignment can be successfully achieved by the present invention so long as the microscope objective is focused on the optical axis of the micro-mirror at the conjugate object and image planes of the micro-mirror.

While this description illustrates what are at present considered to be preferred embodiments of the present invention, it will be understood by those skilled in the art that various changes and modifications may be made, and equivalents may be substituted for elements thereof without departing from the true scope of the present invention. For instance, although ideal thin paraxial lenses are shown in the figures, it would be readily apparent to those of skill that this invention is not limited to any particular lens prescription. In addition, many modifications may be made to adapt a particular situation or material to the teaching of the present invention without departing from the central scope thereof. Therefore, the present invention should not be limited to the particular embodiment disclosed as the best mode contemplated for carrying out the present invention. Rather, the present invention is intended to include all embodiments falling within the scope of the appended claims.

Furthermore, the foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A projection eyepiece for a device that detects alignment between positions on opposing surfaces of a substrate having a reflective surface on at least a portion of one surface side, the eyepiece comprising:
   a reticle source structured and arranged to project a reticle image toward the substrate; and
   a detection device structured and arranged to receive a reflection of the reticle image from the reflective surface and to determine alignment of the positions on opposing surfaces of the substrate by comparing the projected reticle image to the received reflection.

2. The projection eyepiece of claim 1, wherein the reticle source is structured and arranged to project the reticle image with a focal point on a first side of the substrate, and wherein the reflection of the reticle image is received by the detection device from a second and opposing surface of the substrate.

3. The projection eyepiece of claim 1, wherein the reticle source comprises:
   a source capable of projecting light; and
   a reticle positioned to receive the projected light from the source, the reticle being structured and arranged such that light therefrom forms a reticle image.

4. The projection eyepiece of claim 3, wherein the detection device comprises:

a plane upon which the received reflection is compared with at least one of the projected reticle image and a representation of the projected reticle image.

5. The projection eyepiece of claim 4, wherein a second reticle is used to generate the representation of the projected reticle image on the plane with which the received reflection is compared to determine alignment.

6. The projection eyepiece of claim 5, wherein the reticle source further comprises:

a beam splitter upon which the reticle image is incident, the beam splitter being structured and arranged to split the incident reticle image such that the reticle image is projected toward the substrate and toward the detection device.

7. The projection eyepiece of claim 4, wherein the reticle source further comprises:

a polarization sensitive beam splitter upon which the reticle image is incident, the beam splitter being structured and arranged to reflect incident light of a first predetermined polarity and pass incident light of a second predetermined polarity.

8. The projection eyepiece of claim 7, wherein the reticle source further comprises:

a linear polarizer positioned to receive light from the source, the linear polarizer being structured and arranged to pass light of the first predetermined polarity such that the light passing through the linear polarizer is reflected by the polarization sensitive beam splitter.

9. The projection eyepiece of claim 8, wherein the beam splitter is structured and arranged to reflect light of the first predetermined polarity toward the detection device.

10. The projection eyepiece of claim 9, wherein the detection device further comprises:

an image perceiving device structured and arranged to receive at least the reflection of the reticle image from the substrate; and a second linear polarizer positioned between the reticle and the image perceiving device, the linear polarizer being structured and arranged to block light from the source that passes through the reticle.

11. The projection eyepiece of claim 10, wherein the reticle is positioned between the image perceiving device and the beam splitter, wherein the reticle is a reflective reticle that generates the reticle image by reflecting light incident from the beam splitter, wherein the reticle source further comprises a quarter wave plate positioned between the beam splitter and the reflective reticle, and wherein the detection device further comprises a quarter wave plate positioned between the reflective reticle and the second linear polarizer.

12. The projection eyepiece of claim 4, wherein the source is structured and arranged to project polarized light, and wherein the reticle source further comprises:

a nonpolarizing beam splitter upon which the polarized light is incident, the beam splitter being structured and arranged to reflect the incident polarized light and to pass light that is orthogonal to the incident polarized light.

13. The projection eyepiece of claim 12, wherein the detection device further comprises:

an image perceiving device structured and arranged to receive at least the reflection of the reticle image from the substrate; and a linear polarizer positioned between the reticle and the image perceiving device, the linear polarizer being structured and arranged to block light passing through the reticle from the source.

14. The projection eyepiece of claim 13, wherein the detection device further comprises:

a quarter wave plate positioned between the beam splitter and the substrate.

15. The projection eyepiece of claim 14, wherein the reticle is positioned between the image perceiving device and the beam splitter, wherein the reticle is a reflective reticle that generates the reticle image by reflecting light incident from the beam splitter.

16. The projection eyepiece of claim 4, wherein the source comprises:

a light source capable of generating light;

a collimator capable of collimating the generated light; and a linear polarizer capable of polarizing the collimated light.

17. The projection eyepiece of claim 4, wherein the source comprises:

a light source capable of generating light;

a focusing lens and diffuser grating capable of focussing the generated light onto reflective portions of a reticle; and a linear polarizer capable of polarizing the focused light.

18. A method for detecting alignment between positions on opposing surfaces of a substrate having a reflective surface on at least a portion of one surface side, comprising:

projecting a reticle image toward the substrate; and detecting alignment by receiving a reflection of the reticle image from the reflective surface and determining alignment of the positions on opposing surfaces of the substrate by comparing the projected reticle image to the received reflection.

19. The method of claim 18, wherein the projecting involves projecting the reticle image with a focal point on a first side of the substrate, and wherein the detecting involves receiving the reflection of the reticle image from a second and opposing surface of the substrate.

20. The projection eyepiece of claim 18, wherein the detecting involves comparing the received reflection on a plane with at least one of the projected reticle image and a representation of the projected reticle image.

21. The method of claim 20, wherein the comparing is performed by using a reticle as the representation of the projected reticle image on the plane.

22. The method of claim 21, wherein the projecting involves passing the reticle image through a beam splitter that is structured and arranged to project the reticle image toward the substrate and toward the detection device.

23. The method of claim 20, wherein the projecting involves passing the reticle image through a polarization sensitive beam splitter that is structured and arranged to reflect incident light of a first predetermined polarity and pass incident light of a second predetermined polarity.

24. The method of claim 23, wherein the projecting further involves:

passing light through a linear polarizer that is structured and arranged to pass light of the first predetermined polarity such that the light passing through the linear polarizer is reflected by the polarization sensitive beam splitter.

25. The method of claim 24, wherein the projecting further involves:

reflecting light of the first predetermined polarity from the beam splitter toward an image perceiving device structured and arranged to receive at least the reflection of the reticle image from the substrate.

26. The method of claim 25, wherein the detecting further involves:

preventing non-reflected projected light from passing into the image perceiving device.

27. The method of claim 26, wherein projecting the reticle image involves:

generating the reticle image by using a reticle to reflect light incident from the beam splitter.

28. The method of claim 20, wherein the projecting involves:

projecting polarized light upon a nonpolarizing beam splitter that is structured and arranged to reflect the incident polarized light and to pass light that is orthogonal to the incident polarized light.

29. The method of claim 20, wherein the projecting comprises:

generating light;

collimating the generated light; and polarizing the collimated light.

30. The method of claim 20, wherein the source comprises:

generating light;

focussing the generated light onto reflective portions of a reticle; and polarizing the focused light.

* * * * *